(12) United States Patent
Fasoli et al.

(10) Patent No.: US 7,593,249 B2
(45) Date of Patent: Sep. 22, 2009

(54) MEMORY DEVICE FOR PROTECTING MEMORY CELLS DURING PROGRAMMING

(75) Inventors: Luca G. Fasoli, San Jose, CA (US); Tyler Thorp, Sunnyvale, CA (US)

(73) Assignee: Sandisk 3D LLC, Milpitas, CA (US)

( * ) Notice: Subject to any disclaimer, the term of this patent is extended or adjusted under 35 U.S.C. 154(b) by 0 days.

(21) Appl. No.: 12/140,991

(22) Filed: Jun. 17, 2008

(65) Prior Publication Data

US 2008/0247213 A1  Oct. 9, 2008

Related U.S. Application Data

(62) Division of application No. 11/552,426, filed on Oct. 24, 2006, now Pat. No. 7,391,638.

(51) Int. Cl.
*G11C 16/24* (2006.01)

(52) U.S. Cl. ............. 365/105; 365/185.02; 365/185.23; 365/185.28

(58) Field of Classification Search .................. 365/105, 365/185.02
See application file for complete search history.

(56) References Cited

U.S. PATENT DOCUMENTS

| | | | |
|---|---|---|---|
| 5,172,338 A | 12/1992 | Mehrotra et al. | |
| 5,499,211 A | 3/1996 | Kirihata et al. | |
| 5,684,732 A | 11/1997 | Sako | |
| 5,740,116 A | 4/1998 | Proebsting | |
| 5,991,517 A | 11/1999 | Harari et al. | |
| 6,034,882 A | 3/2000 | Johnson et al. | |
| 6,141,253 A * | 10/2000 | Lin | 365/185.28 |
| 6,269,022 B1 | 7/2001 | Ra | |
| 6,278,642 B1 | 8/2001 | Lakhani et al. | |
| 6,301,158 B1 | 10/2001 | Iwahashi | |
| 6,384,666 B1 | 5/2002 | Bertin et al. | |
| 6,574,145 B2 | 6/2003 | Kleveland et al. | |
| 6,614,691 B2 | 9/2003 | Roohparvar | |
| 6,704,235 B2 | 3/2004 | Knall et al. | |
| 6,891,748 B2 | 5/2005 | Tsuchida et al. | |
| 7,253,496 B2 | 8/2007 | Jenne et al. | |
| 7,319,609 B2 * | 1/2008 | Chih | 365/185.02 |
| 2002/0136076 A1 | 9/2002 | Kleveland | |

(Continued)

FOREIGN PATENT DOCUMENTS

EP  1 505 605 A  2/2005

OTHER PUBLICATIONS

Baek et al., "Highly Scalable Non-volatile Resistive Memory using Simple Binary Oxide Driven by Asymmetric Unipolar Voltage Pulses", IEDM 04, 2004, pp. 587-590.

(Continued)

*Primary Examiner*—Tan T. Nguyen

(57) ABSTRACT

Improved circuitry and methods for programming memory cells of a memory device are disclosed. The improved circuitry and methods operate to protect the memory cells from potentially damaging electrical energy that can be imposed during programming of the memory cells. Additionally, the improved circuitry and methods operate to detect when programming of the memory cells has been achieved. The improved circuitry and methods are particularly useful for programming non-volatile memory cells. In one embodiment, the memory device pertains to a semiconductor memory product, such as a semiconductor memory chip or a portable memory card.

39 Claims, 6 Drawing Sheets

U.S. PATENT DOCUMENTS

| | | |
|---|---|---|
| 2005/0117399 A1 | 6/2005 | Kwon et al. |
| 2005/0121742 A1 | 6/2005 | Petti et al. |
| 2006/0067117 A1 | 3/2006 | Petti et al. |
| 2006/0139994 A1 | 6/2006 | Bill et al. |
| 2008/0094892 A1 | 4/2008 | Fasoli |
| 2008/0094913 A1 | 4/2008 | Fasoli |

OTHER PUBLICATIONS

Baek et al., "Multi-layer Cross-point binary Oxide Resistive Memory (OxRRAM) for Post-NAND Storage Application", IEEE 0-7803-9269, 2005.

Hwang et al., "Writing Current Reduction for High-density Phase-change RAM", IEDM 03, IEEE 0-7803-7872, 2003, pp. 893-896.

Johnson et al., "512-Mb PROM With a Three-Dimensional Array of Diode/Antifuse Memory Cells", IEEE J. Of Solid-State Circuitry, vol. 38, No. 11, Nov. 2003, pp. 1920-1928.

Pirovano et al., "Electronic Switching in Phase-Change Memories", IEEE Transactions on Electronic Devices, vol. 51, No. 3, Mar. 2004, 452-459.

Bandyopadhyay et al., "Vertical p-i-n Polysilicon Diode With Antifuse for Stackable Field-Programmable ROM", IEEE Electron Device Letters, vol. 25, No. 5, May 2004 pp. 271-273.

International Search Report and Written Opinion for PCT/US2007/081916, mailed Mar. 26, 2008.

International Preliminary Report on Patentability for PCT/US2007/081916 mailed May 7, 2009.

Office Action in U.S. Appl. No. 11/552,441, mailed Nov. 21, 2008.

* cited by examiner

MEMORY DEVICE FOR PROTECTING MEMORY CELLS DURING PROGRAMMING

CROSS-REFERENCE TO RELATED APPLICATION

This application is a divisional application of U.S. patent application Ser. No. 11/552,426, filed Oct. 24, 2006 now U.S. Pat. No. 7,391,638, entitled "MEMORY DEVICE FOR PROTECTING MEMORY CELLS DURING PROGRAMMING", which is herein incorporated by reference.

This application is related to U.S. application Ser. No. 11/552,441, filed Oct. 24, 2006, and entitled "METHOD FOR PROTECTING MEMORY CELLS DURING PROGRAMMING," which is hereby incorporated herein by reference.

BACKGROUND OF THE INVENTION

1. Field of the Invention

The invention relates to memory devices and, more particularly, to programming non-volatile memory devices.

2. Description of the Related Art

Memory devices that provide persistent data storage use non-volatile memory cells. The memory devices can typically be implemented by semiconductor chips. The semiconductor chips can be used internal to electronic systems or can be used within memory cards that can be removably attached to electronic systems. Memory cards are commonly used to store digital data for use with various products (e.g., electronic products). Memory cards often use Flash type or EEPROM type memory cells to store the data. Memory cards have a relatively small form factor and have been used to store digital data for electronic products (e.g., portable consumer electronic products). A major supplier of memory cards is SanDisk Corporation of Sunnyvale, Calif.

Several methods are known for programming non-volatile memory cells. One method applies a programming pulse of a sufficiently long duration to program a memory cell. In order to guarantee that every memory cell is able to be programmed using this method, programming time and power are set for worst-case conditions. Accordingly, this "over-provisioning" approach can result in excessive average programming time and power. In another method, a series of short, high-voltage programming pulses is applied to a memory cell. After each programming pulse, a nominal-voltage reading pulse is applied to determine whether the memory cell is in a programmed state. If the memory cell is in a programmed state, no further programming pulses are applied. Otherwise, an additional programming pulse is applied, and the sequence of reading and programming continues until the memory cell is eventually in a programmed state. One disadvantage of this approach is the time and power overhead associated with switching between program and read voltages. Another disadvantage of this approach is that the use of short programming pulses (as compared to a long, continuous programming pulse) tends to be less energy efficient.

More recently, a method for programming non-volatile memory cells made use of detection circuits. While a particular memory cell is being programmed, a detection circuit determines whether the memory cell is in a programmed state. Once the memory cell is detected to have reached the programmed state, the programming of the memory cell is terminated. Additional details on this method for programming are provided in U.S. Pat. No. 6,574,145. However, in programming memory cells, the memory cells can be subjected to high voltages and high power which are problematic when the memory cells become programmed and the programming voltage has not yet been removed. Although the programming voltage will be removed in due time after a memory cell has been programmed, the excessive power can cause damage to the already programmed memory cell.

Thus, there is still a need for improved memory devices and programming methods.

SUMMARY OF THE INVENTION

The invention relates to improved circuitry and methods for programming memory cells of a memory device. The improved circuitry and methods operate to protect the memory cells from potentially damaging electrical energy that can be imposed during programming of the memory cells. Additionally, the improved circuitry and methods operate to detect when programming of the memory cells has been achieved. The improved circuitry and methods are particularly useful for programming non-volatile memory cells. In one embodiment, the memory device pertains to a semiconductor memory product, such as a semiconductor memory chip or a portable memory card. The invention can be particularly useful for use with two-terminal memory cells.

The invention can be implemented in numerous ways, including as a method, system, device or apparatus. Several embodiments of the invention are discussed below.

As a memory device, one embodiment of the invention includes at least: a non-volatile memory element; a current monitor configured to monitor a program current flowing through the non-volatile memory element; and a current limiter configured to restrict the current flowing through the non-volatile memory element.

As a memory device, another embodiment of the invention includes at least: a memory array including a plurality of layers of memory cells stacked vertically above one another in a single chip; a detection circuit operative to detect, while a memory cell of the memory array is being programmed, when the memory cell is in a programmed state; and a memory cell protection circuit operative to protect the memory cell of the memory array against excessive electrical energy at least while the memory cell is being programmed.

As a memory device having an array of memory elements accessible via at least one bitline and at least one wordline, one embodiment of the invention includes at least: a first field-effect transistor having first, second and third terminals, the first terminal connected to a first potential; a second field-effect transistor having first, second and third terminals, the first terminal connected to the second terminal of the first field-effect transistor, and the second terminal connected to a bitline; a memory element connected to a wordline and to the bitline; a third field-effect transistor having first, second and third terminals, the first terminal connected to the first potential, the second terminal connected to a first node, and the third terminal connected to the third terminal of the first field-effect transistor; a fourth field-effect transistor having first, second and third terminals, the first terminal connected to the first node, the second terminal connected to a second potential; a fifth field-effect transistor having first, second and third terminals, the first terminal connected to a first current source, the second terminal connected to the second potential, and the third terminal is connected to the third terminal of the fourth field-effect transistor, the first terminal further being connected to the third terminal; a sixth field-effect transistor having first, second and third terminals, the first terminal connected to the first potential, the second terminal connected to a second node, and the third terminal connected to the third terminal of the first field-effect transistor; a seventh field-effect transistor having first, second and third terminals, the first terminal connected to the second node, the second terminal connected to the second potential; an eighth field-effect transistor having first, second and third terminals, the first terminal connected to a second current source, the second terminal connected to the second potential, and the third terminal is connected to the third terminal of the seventh field-effect transistor, the first terminal further being connected to the third terminal; program control circuitry connected to the second node; and a ninth field-effect transistor having first, second and third terminals, the first terminal connected to the first potential, the second terminal connected to the third terminal of the first field-effect transistor, and the third terminal connected to the program control circuitry, wherein the third terminal of the second field-effect transistor is connected to the first node.

As an electronic system, one embodiment of the invention includes at least: a data acquisition device; and a data storage device removably coupled to the data acquisition device. The data storage device stores data acquired by the data acquisition device. The data storage device includes at least: an array of data storage elements; a detection circuit operative to detect, while a data storage element of the array is being programmed, when the data storage element is in a programmed state; and a protection circuit operative to protect the data storage element of the array against excessive electrical energy at least while the memory cell is being programmed.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to improved circuitry and methods for programming memory cells of a memory device. The improved circuitry and methods operate to protect the memory cells from potentially damaging electrical energy that can be imposed during programming of the memory cells. Additionally, the improved circuitry and methods operate to detect when programming of the memory cells has been achieved. The improved circuitry and methods are particularly useful for programming non-volatile memory cells. In one embodiment, the memory device pertains to a semiconductor memory product, such as a semiconductor memory chip or a portable memory card. The invention can be particularly useful for use with two-terminal memory cells.

Embodiments of this aspect of the invention are discussed below with reference to FIGS. 1-7. However, those skilled in the art will readily appreciate that the detailed description given herein with respect to these figures is for explanatory purposes as the invention extends beyond these limited embodiments.

Figure 1:
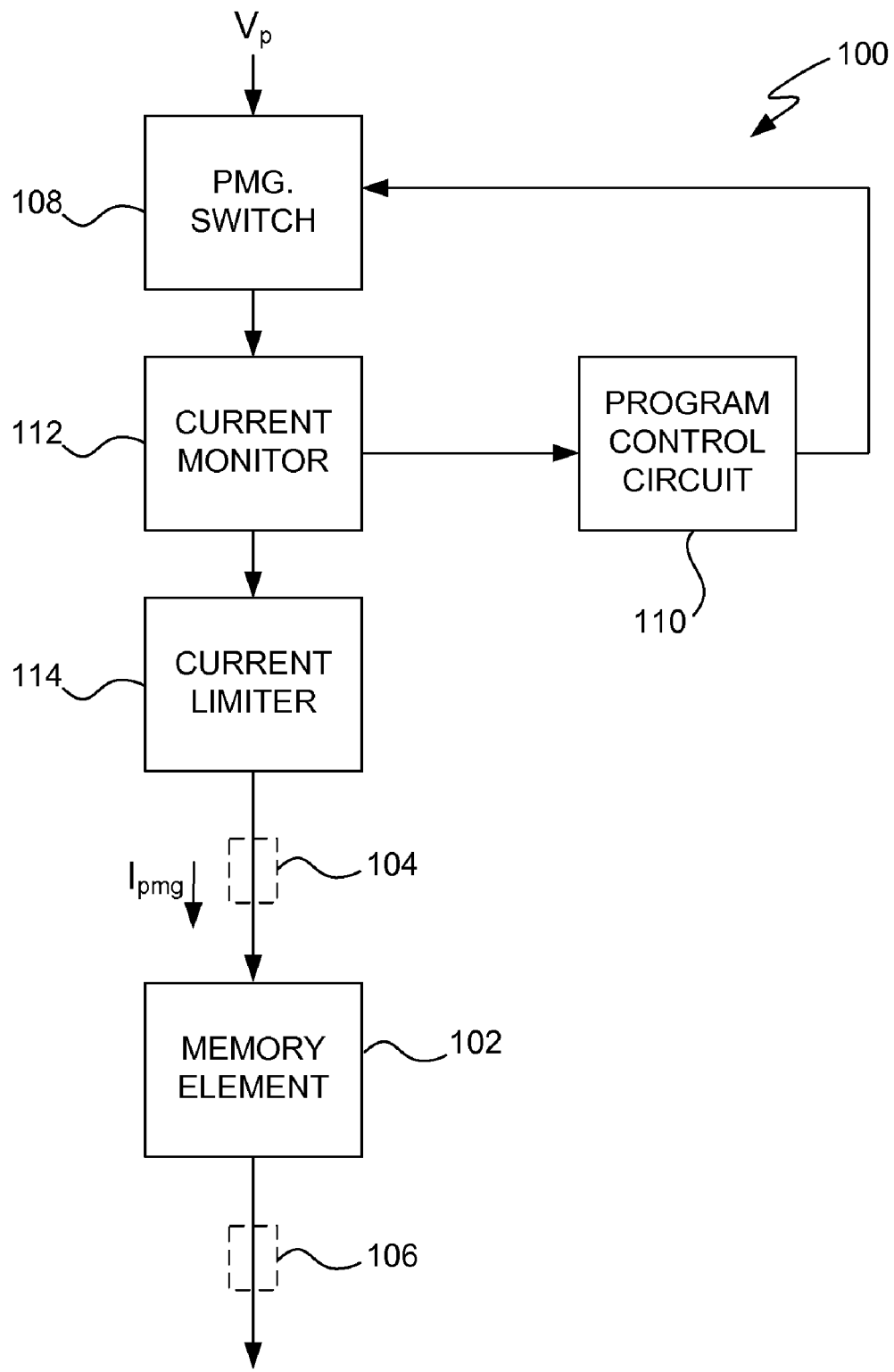
FIG. 1 is a block diagram of a memory device according to one embodiment of the invention.

FIG. 1 is a block diagram of a memory device 100 according to one embodiment of the invention. The memory device 100 includes a memory element 102. The memory element 102 is, for example, a non-volatile memory element. One implementation for a non-volatile memory element is a diode or antifuse type memory element. The memory element 102 is typically part of a memory array. The various memory elements within the memory array can be accessed by way of bitlines 104 and wordlines 106. Hence, the memory element 102 is shown as being coupled between a bitline 104 and a wordline 106. When programming the memory element 102, a voltage is applied across the memory element 102 to invoke a physical characteristic change in the memory element 102. As an example, when the memory element 102 corresponds to an antifuse type device, the programming of the memory element 102 is referred to as "popping" or "blowing" the antifuse.

The memory device 100 includes a programming switch 108. The programming switch 108 couples to a voltage potential (Vp) used for programming. When the programming switch 108 is enabled by a program control circuit 110, a program current (Ipmg) is supplied from the voltage potential (Vp) to a current monitor 112. The current monitor 112 monitors the program current (Ipmg) that flows through the memory element 102. Here, in this embodiment, the amount of current flowing through the memory element 102 provides an indication of whether or not the memory element 102 has been programmed. In other words, while the memory element 102 is being programmed by the program current (Ipmg), the current monitor 112 monitors the level of the program current (Ipmg). The monitored current level detected by the current monitor 112 is supplied to the program control circuit 110. The program control circuit 110 based on the monitored current level determines whether the memory element 102 has been completely programmed. When the program control circuit 110 determines that the memory element 102 has been programmed, the program control circuit 110 can signal the programming switch 108 to deactivate the programming. In one embodiment, the program control circuit 110 can impose a delay prior to deactivating the programming.

The memory device 100 also includes a current limiter 114. The current limiter 114 operates to limit the maximum amount of current that is permitted to be used when programming the memory element 102. In other words, the current limiter 114 prevents the program current (Ipmg) from exceeding a maximum current level. The current limiter 114 thus protects the memory element 102 from damage during or after programming of the memory element 102.

Besides providing protection for a memory element during programming, a current limiter can also protect a memory element when not being programmed. For example, in some embodiments, a pre-charging is performed in advance of programming to improve the programming. Hence, the protection for the memory cells can also be used to protect the memory elements during pre-charging.

The programming of the memory cells can be efficient with regard to programming time and power. For example, a memory cell can be pre-charged rapidly since the current used for pre-charge can be set to the maximum level that the memory cell can withstand. Additionally, in programming a memory cell, programming occurs only for as long as it is needed. That is, unlike a fixed program duration, once a memory cell becomes programmed, its programming can be stopped. Further, programming bandwidth (the number of memory cells that can be programmed per unit time) can be high. In one embodiment, a plurality of memory cells along a wordline can be programmed simultaneously.

The memory element being programmed can relate to a non-volatile memory cell (i.e., a memory cell whose data is not lost or altered when electrical power is removed). Although any suitable memory array can be used, in one embodiment, the memory cell is part of a three-dimensional memory array, which can provide economies in terms of reduced size and associated reductions in manufacturing cost. In one implementation, the memory array can include a vertical array of layers as memory cells. The memory array can be part of a compact, modular memory device used with portable consumer electronic products. In one embodiment, the memory cell is field-programmable. A field-programmable memory cell is a memory cell that is fabricated in an initial, un-programmed digital state and can be switched to an alternative, programmed digital state at a time after fabrication. Although any suitable type of memory cell can be used, in one embodiment, the memory cell is a write-once memory cell comprising an antifuse and a diode, for example as described in U.S. Pat. Nos. 6,034,882 and 6,515,888, both of which are hereby incorporated by reference. In its un-programmed state, the antifuse is intact, and the memory cell holds a Logic 1. When suitable voltages are applied to the appropriate wordline and bitline, the antifuse of the memory cell is blown, and the diode is connected between the wordline and the bitline. This places the memory cell in a programmed (Logic 0) state. Alternatively, the un-programmed state of the memory cell can be Logic 0, and the programmed state can be Logic 1. Memory cells that support multiple programmed states can also be used. If the memory is of the write-once type, the initial, un-programmed digital state cannot be restored once the memory cell is switched to the programmed digital state. Instead of being write-once, the memory cell can be write-many (re-writeable). Unlike the digital state of a write-once memory cell, the digital state of a write-many memory cell can be switched between "un-programmed" and "programmed" digital states. When referring to write-many memory cells, the un-programmed digital state refers to the digital state of the memory cell before a programming operation. Accordingly, the un-programmed digital state can refer to either Logic 0 or Logic 1 (in a two-state memory cell) and does not necessarily refer to the digital state in which that memory cell was fabricated.

Figure 2:
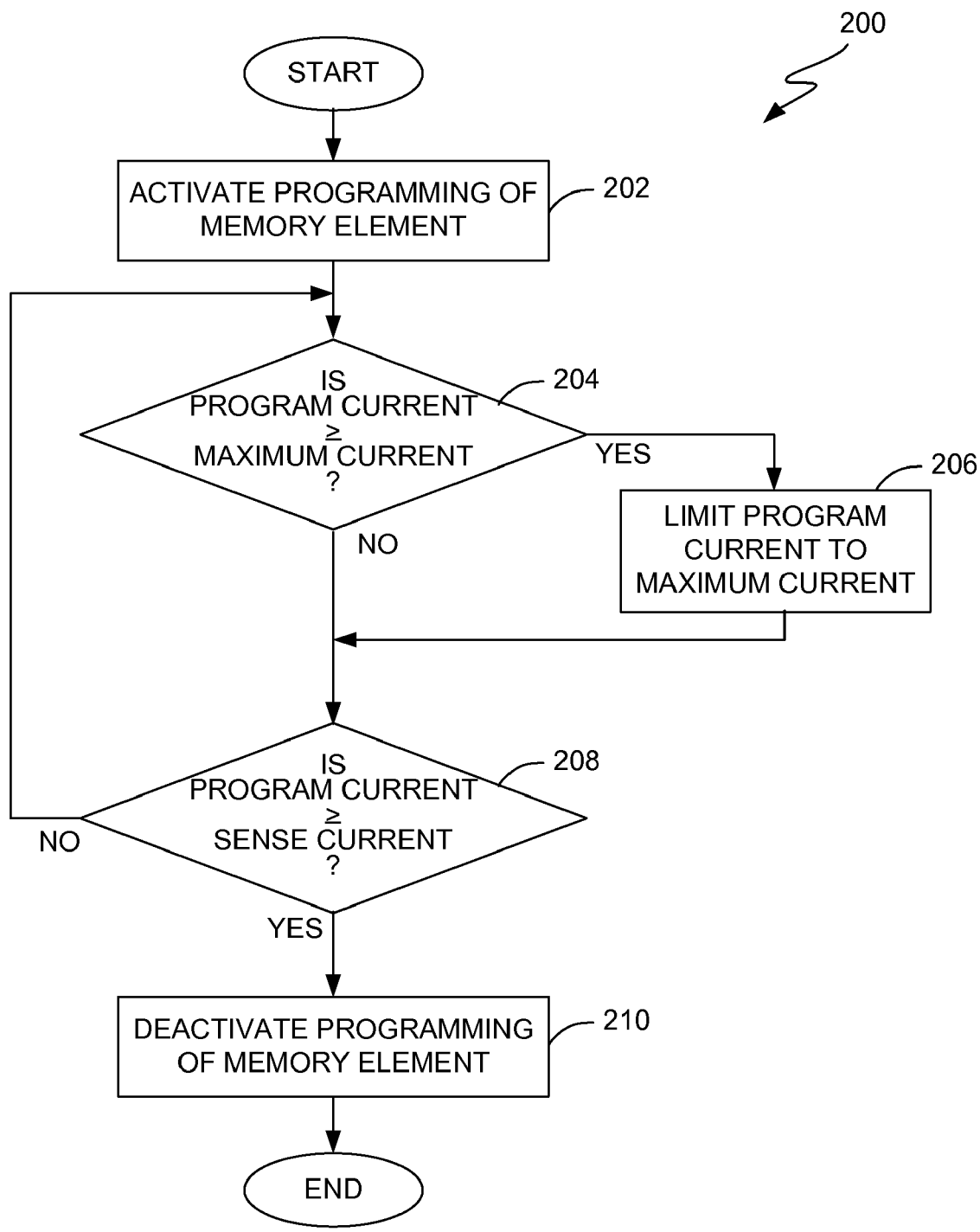
FIG. 2 is a flow diagram of a memory programming process according to one embodiment of the invention.

FIG. 2 is a flow diagram of a memory programming process 200 according to one embodiment of the invention. The memory programming process 200 is, for example, associated with programming a memory element, such as a memory element within a memory array provided within a memory device.

The memory programming process 200 initially activates 202 programming of a memory element. The memory element is one of a plurality of memory elements provided within a memory device. For example, the memory element to be programmed can pertain to the memory element 102 of the memory device 100 illustrated in FIG. 1.

A decision 204 then determines whether a program current (programming current) is greater than or equal to a maximum current. When the decision 204 determines that the program current is greater than or equal to the maximum current, the program current is limited 206 to the maximum current. Following the block 206, or following the decision 204 when the program current is not greater than or equal to the maximum current, a decision 208 determines whether the program current is greater than or equal to a sense current. The sense current is an amount of current used to sense whether the programming element has been programmed. When the decision 208 determines that the program current is not greater than or equal to the sense current, then the memory programming process 200 returns to repeat the decision 204 and subsequent blocks so that the programming of the memory element can continue. In doing so, the memory element is protected from damage by the block 206 which prevents the program current from exceeding the maximum current. On the other hand, when the decision 208 determines that the program current is greater than the sense current, then programming of the memory element is deactivated 210. Here, the programming of the memory element is deactivated 210 because the memory element has been programmed. In other words, when the program current reaches the level of the sense current, then the memory element is programmed. Following the block 210, the memory programming process 200 ends.

Hence, in one embodiment, the programming of a memory element is efficient and effective. First, the program current used during programming can be high since the program current is guaranteed not to exceed the maximum current for the memory element. The high program current leads to rapid programming of the memory element. Second, the program time for the memory element is optimized to the memory element itself. That is, when the memory element becomes programmed, the programming of the memory element ceases.

Figure 3:
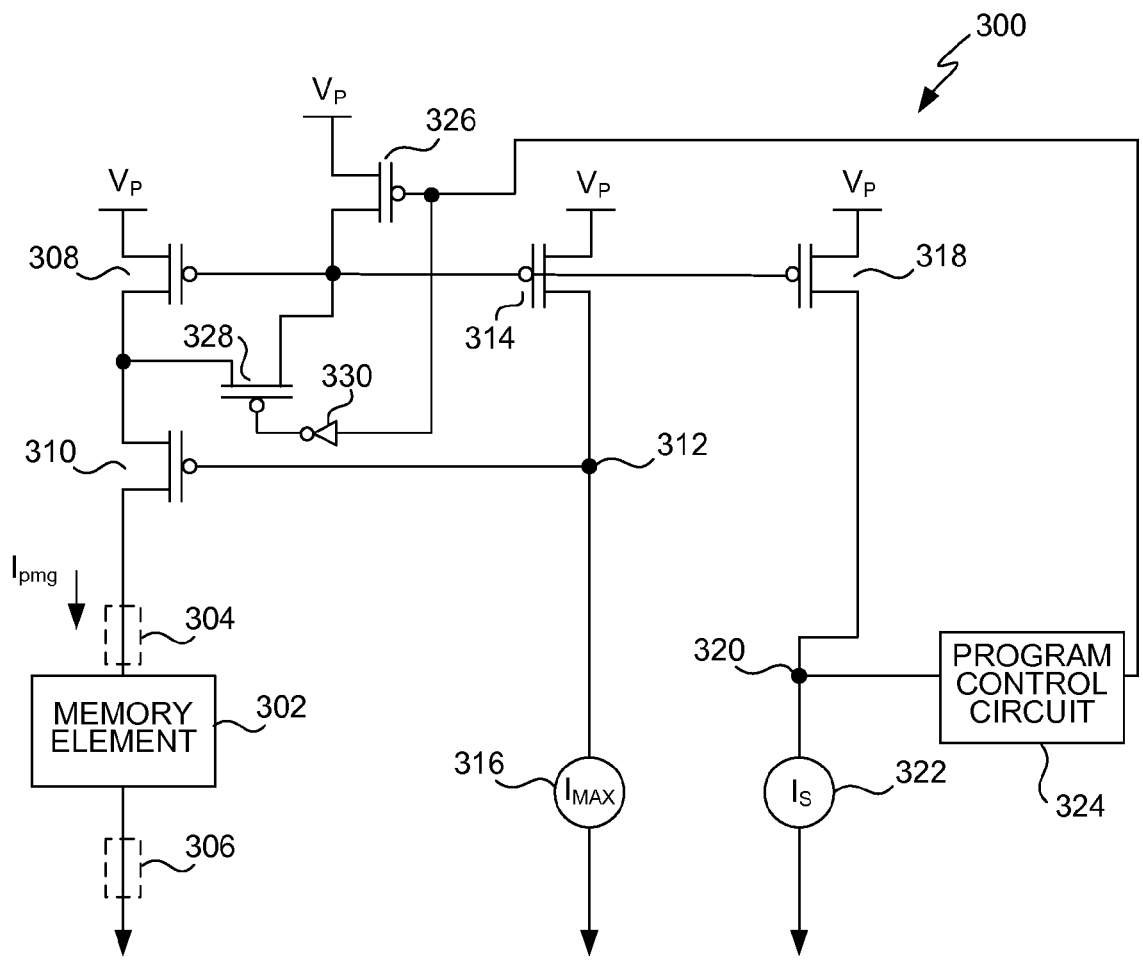
FIG. 3 is a schematic diagram of a memory device according to one embodiment of the invention.

FIG. 3 is a schematic diagram of a memory device 300 according to one embodiment of the invention. The memory device 300 includes a memory element 302. As depicted in FIG. 3, the memory element 302 is being programmed (written). The memory element 302 is coupled between a bitline 304 and a wordline 306, which enables selection of the memory element 302 from a plurality of memory elements in the memory device 300. The memory element 302 is programmed by supplying a programming voltage across the memory element 302 which induces a program current (Ipmg) through the memory element 302. The program current (Ipmg) is supplied by a field-effect transistor (FET) 308.

The program current (Ipmg) is also limited by a FET 310. The FET 310 is controlled by a node 312. The node 312 is provided between a FET 314 and a current source (Imax) 316. When the program current (Ipmg) exceeds the maximum current (Imax), the node 312 is pulled high by the FET 314. As a result, in such case, the FET 310 operates to restrict or stop the program current (Ipmg) from reaching the memory element 302.

The memory device 300 also includes a FET 318 that couples between the programming potential (Vp) and a node 320. The node 320 is also coupled to ground by way of a sense current source (Is) 322. When the program current (Ipmg) exceeds the sense current (Is), the second node 320 is pulled high by the FET 318. In such case, the program control circuit 324 can cause a FET 326 to turn off the FET 308, thereby ceasing programming of the memory element 302. Additionally, when the second node 320 is pulled high by the FET 318, the program control circuit 324 can cause a FET 328 to turn off, thereby disconnecting the gate of the FET 308 from the drain of the FET 308. The program control circuit 324 can turn off the FET 328 via an inverter 330. In one implementation, the program control circuit 324 can induce a delay and thus need not be immediately responsive to a change in voltage level of the second node 320.

Figure 4:
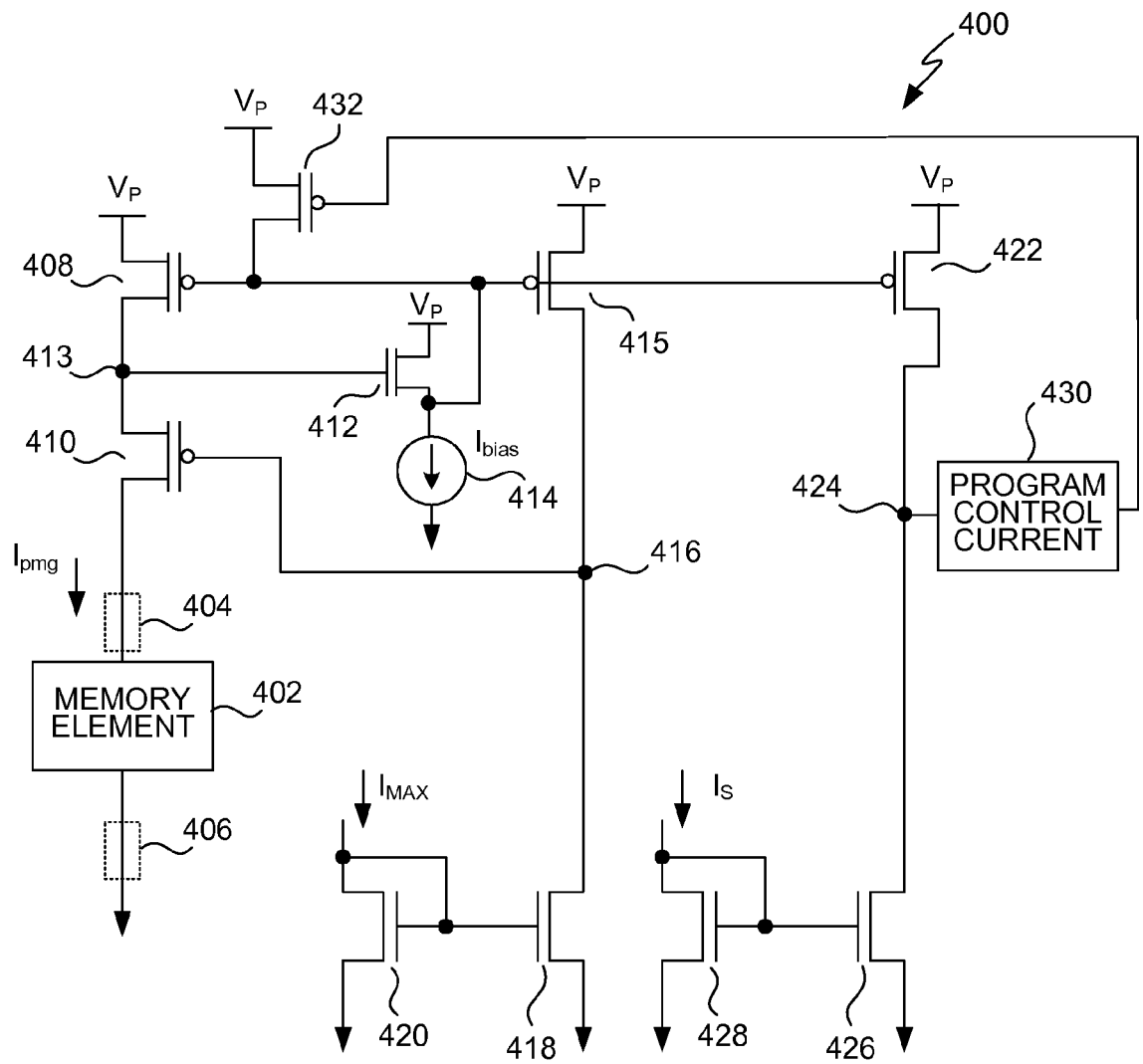
FIG. 4 is a schematic diagram of a memory device according to another embodiment of the invention.

FIG. 4 is a schematic diagram of a memory device 400 according to another embodiment of the invention. The memory device 400 illustrated in FIG. 4 is generally similar to the memory device 300 illustrated in FIG. 3. However, the memory device 400 includes additional implementation details that can be provided in accordance with one embodiment of the invention.

The memory device 400 includes a memory element 402. The memory element 402 is coupled between a bitline 404 and a wordline 406. The memory device 400 operates, in one mode, to program the memory element 402 by applying a voltage across the memory element 402. The result of the voltage across the memory element 402 is to effectuate programming of the memory element. In one implementation, as the memory element 402 is being programmed, the program current (Ipmg) passing through the memory element 402 increases. At some point, the level of the program current (Ipmg) can signal that the memory element 402 has been adequately programmed.

The memory device 400 includes a first FET 408 that couples to a voltage potential (Vp) suitable for programming. The first FET 408 is utilized to provide the program current (Ipmg) that is used to program the memory element 402. A second FET 410 couples between the first FET 408 and the memory element 402. The second FET 410 is utilized to limit the amount of current that can flow through to the memory element 402. In other words, the FET 410 is controlled to limit the program current (Ipmg) to a maximum level. A third FET 412 is also provided to bias a gate terminal of the FET 408. A source terminal of the FET 408 is coupled to the voltage potential (Vp) and a drain terminal of the FET 408 is coupled to a drain terminal of the FET 410 at a node 413. A source terminal of the FET 410 is coupled to the memory element 402 by way of the bitline 404. A drain terminal of the FET 412 is coupled to the voltage potential (Vp), a gate terminal of the FET 412 is connected to the node 413, and a source terminal of the FET 412 is coupled to the gate terminal of the FET 408 as well as to a bias current source (Ibias) 414.

To control the FET 410, the memory device 400 also includes a FET 415, a node 416, and FETs 418 and 420. The FET 415 has a source terminal connected to the voltage potential (Vp), a gate terminal connected to the gate terminal of the FET 408, and a drain terminal connected to the node 416. The gate terminal of the FET 410 also connects to the node 416. The FETs 418 and 420 are connected to form a current mirror circuit for a maximum reference current (Imax).

During operation, the program current (Ipmg) that passes from the source terminal to the drain terminal of the FET 408 is mirrored to the FET 415. This program current (Ipmg) is compared to a maximum current (Imax) at the node 416. If the program current exceeds the maximum current, the node 416 is pulled high so as to restrict or prevent the program current (Ipmg) from being provided to the memory element 402.

The memory device 400 also includes a FET 422, a node 424, and FETs 426 and 428. The FET 422 has a source terminal connected to the voltage potential (Vp), a gate terminal connected to the gate terminal of the FET 408 and a drain terminal connected to a node 424. The FETs 426 and 428 provide a current mirror circuit for a sense reference current (Is). A drain terminal of the FET 426 is coupled to the node 424. The program current (Ipmg) that passes from the source terminal to the drain terminal of the FET 408 is mirrored to the FET 422. Hence, the node 424 can determine whether the program current (Ipmg) exceeds the sense reference current (Is). When the program current (Ipmg) exceeds the sense reference current (Is), the node 424 is pulled high. When the node 424 is pulled high, a program control circuit 430 understands that the programming of the memory element 402 has been completed. At this point, either immediately or following a predetermined delay, the program control circuit 430 can instruct a FET 432 to disable further programming of the memory element 402. The FET 432 has its source terminal connected to the voltage potential (Vp) and a drain terminal connected to the gate terminal of the FET 408. Further, the gate terminal of the FET 432 is connected to the program control circuit 430.

To reduce power consumption, the current mirror circuits can use a different ratio than the programming circuitry. For example, the channel width for the FETs 415 and 422 can be made smaller than the channel width of the FET 408, thereby producing lower currents in the current mirror circuits which in turn reduces power consumption. As another example, the FET 408 could be manufactured to be N-times that of the FETs 415 and 422, where N is the desired current ratio. In such an example, the FET 408 can be implemented using N transistors used in parallel relative to using one transistor for the FETs 415 and 422.

Figure 5:
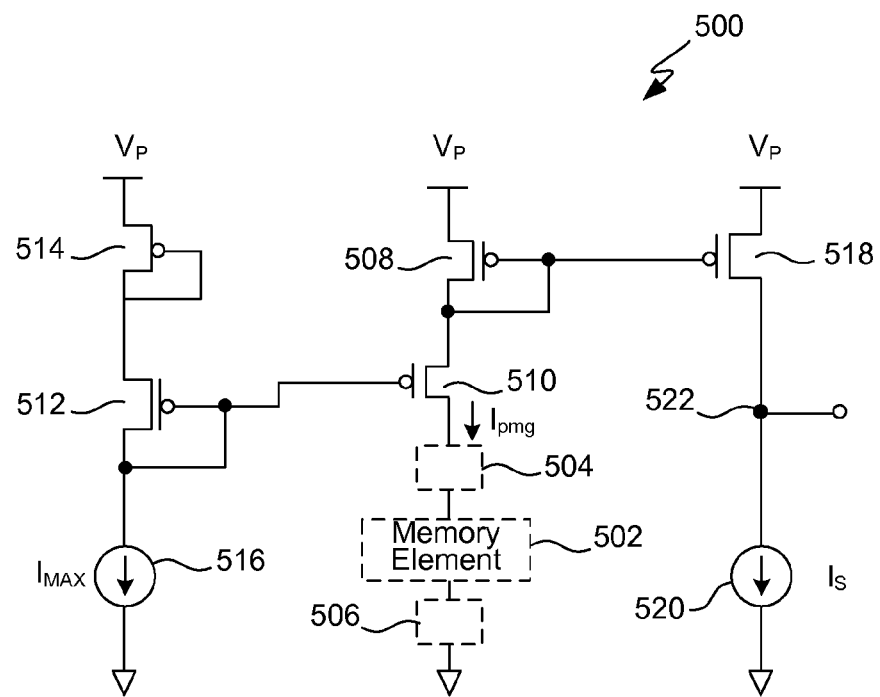
FIG. 5 is a schematic diagram of a memory device according to another embodiment of the invention.

FIG. 5 is a schematic diagram of a memory device 500 according to another embodiment of the invention. The memory device 500 illustrated in FIG. 5 provides separate circuitry for monitoring programming and limiting program current as do the memory device 300 illustrated in FIG. 3 and the memory device 400 illustrated in FIG. 4. The memory device 500 utilizes a double current mirror design.

The memory device 500 includes a memory element 502. The memory element 502 is coupled between a bitline 504 and a wordline 506. The memory device 500 operates, in one mode, to program the memory element 502 by applying a voltage across the memory element 502. The result of the voltage across the memory element 502 is to effectuate programming of the memory element 502. In one implementation, as the memory element 502 is being programmed, the program current (Ipmg) passing through the memory element 502 increases. At some point, the level of the program current (Ipmg) can signal that the memory element 502 has been adequately programmed.

The memory device 500 includes a first FET 508 that couples to a voltage potential (Vp) suitable for programming. The first FET 508 is utilized to provide the program current (Ipmg) that is used to program the memory element 502. A second FET 510 couples between the first FET 508 and the memory element 502. The second FET 510 is utilized to limit the amount of current that can flow through to the memory element 502. In other words, the FET 510 is controlled to limit the program current (Ipmg) to a maximum level. A source terminal of the FET 508 is coupled to the voltage potential (Vp) and a drain terminal of the FET 508 is coupled to a drain terminal of the FET 510. A source terminal of the FET 510 is coupled to the memory element 502 by way of the bitline 504. A third FET 512, a fourth FET 514 and a current source (Imax) 516 are connected in series to bias a gate terminal of the FET 510 such that the program current (Ipmg) does not exceed the maximum current (Imax). The FETs 510 and 512 are connected to form a current mirror circuit for a maximum reference current (Imax).

The memory device 500 also includes a FET 518, a current source (Is) 520 and a node 522. The FET 518 has a source terminal connected to the voltage potential (Vp), a gate terminal connected to the gate terminal of the FET 508 and a drain terminal connected to the node 522. The FETs 508 and 510 provide another current mirror used to compare the program current (Ipmg) with a sense reference current (Is). The program current (Ipmg) that passes from the source terminal to the drain terminal of the FET 508 is mirrored to the FET 518. Hence, the node 522 can determine whether the program current (Ipmg) exceeds the sense reference current (Is). When the program current (Ipmg) exceeds the sense reference current (Is), the node 522 is pulled high. When the node 522 is pulled high, a program control circuit (not shown) understands that the programming of the memory element 502 has been completed. At this point, either immediately or following a predetermined delay, the program control circuit can disable further programming of the memory element 502.

Figure 6:
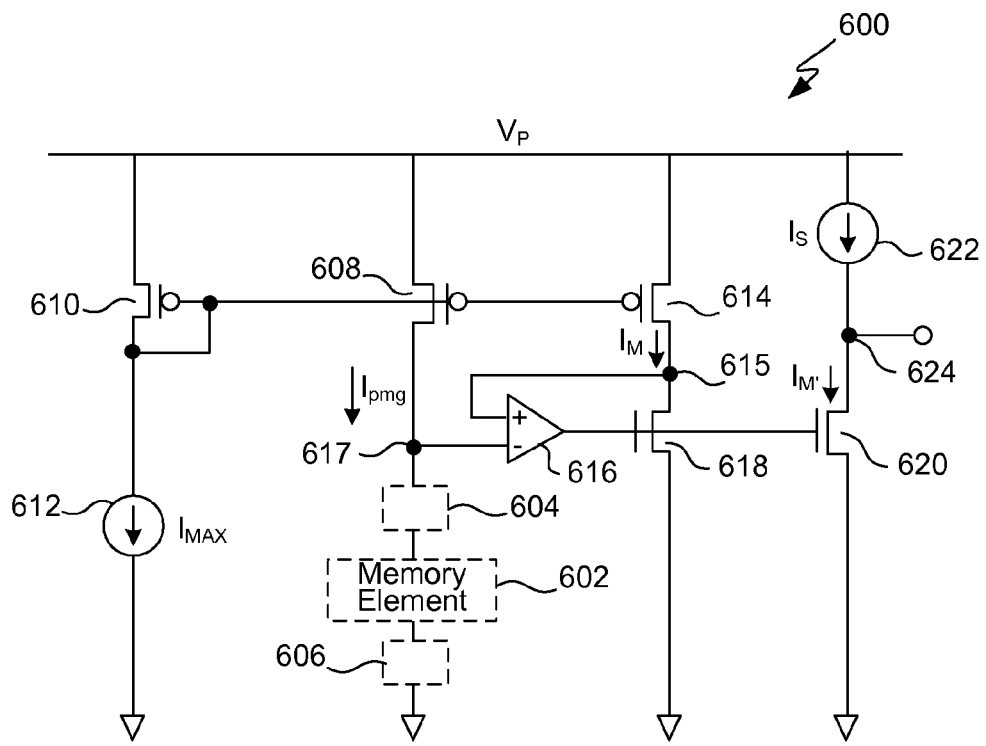
FIG. 6 is a schematic diagram of a memory device according to another embodiment of the invention.

FIG. 6 is a schematic diagram of a memory device 600 according to another embodiment of the invention. The memory device 600 illustrated in FIG. 6 provides separate circuitry for monitoring programming and limiting program current. The memory device 600 utilizes a current mirror and a replicated memory element current path.

The memory device 600 includes a memory element 602. The memory element 602 is coupled between a bitline 604 and a wordline 606. The memory device 600 operates, in one mode, to program the memory element 602 by applying a voltage across the memory element 602. The result of the voltage across the memory element 602 is to effectuate programming of the memory element 602. In one implementation, as the memory element 602 is being programmed, the program current (Ipmg) passing through the memory element 602 increases. At some point, the level of the program current (Ipmg) can signal that the memory element 602 has been adequately programmed.

The memory device 600 includes a first FET 608 that couples to a voltage potential (Vp) suitable for programming. The first FET 608 is utilized to provide the program current (Ipmg) that is used to program the memory element 602. A source terminal of the FET 608 is coupled to the voltage potential (Vp) and a drain terminal of the FET 608 is coupled to the memory element 602 by way of the bitline 604. A second FET 61 0 and a current source (Imax) 612 are connected in series. A source terminal of the FET 610 is coupled to the voltage potential (Vp) and a drain terminal of the FET 610 is coupled to the current source (Imax) 612. The gate terminals of the FETs 608 and 610 are connected together. The FET 610 and the current source (Imax) 612 operate to bias a gate terminal of the FET 608 such that the program current (Ipmg) does not exceed the maximum current (Imax). In other words, the FETs 608 and 610 are connected to form a current mirror circuit that operates to prevent the program current (Ipmg) from exceeding a maximum reference current (Imax).

The memory device 600 also includes a FET 614, a comparator 616 and a FET 518 to replicate the memory element current path. The FETs 614 and 618 are connected in series between the voltage potential (Vp) and ground. A node 615 is provided at the connection of the FETs 614 and 618. The comparator 616 compares the voltage at the node 615 with the voltage at node 617, which is at the connection of the FET 608 and the memory element 602. The output of the comparator 616 serves to bias the gate terminal of the FET 618 such that a monitored current (Im) is substantially the same (i.e., replicated) as the program current (Ipmg). Further, the memory device includes a FET 620 and current source (Is) 622. The current source (Is) 622 is connected to the voltage potential (Vp) and to a node 624. The FET 620 is connected between the node 622 and ground. The gate of the FET 620 is connected to the gate of the FET 618 such that a mirrored monitored current (Im') is drawn from the node 624 by the FET 620. Hence, the node 624 can determine whether the program current (Ipmg) exceeds the sense reference current (Is). When the program current (Ipmg) exceeds the sense reference current (Is), the node 622 is pulled low. When the node 622 is pulled low, a program control circuit (not shown) understands that the programming of the memory element 602 has been completed. At this point, either immediately or following a predetermined delay, the program control circuit can disable further programming of the memory element 602.

Figure 7:
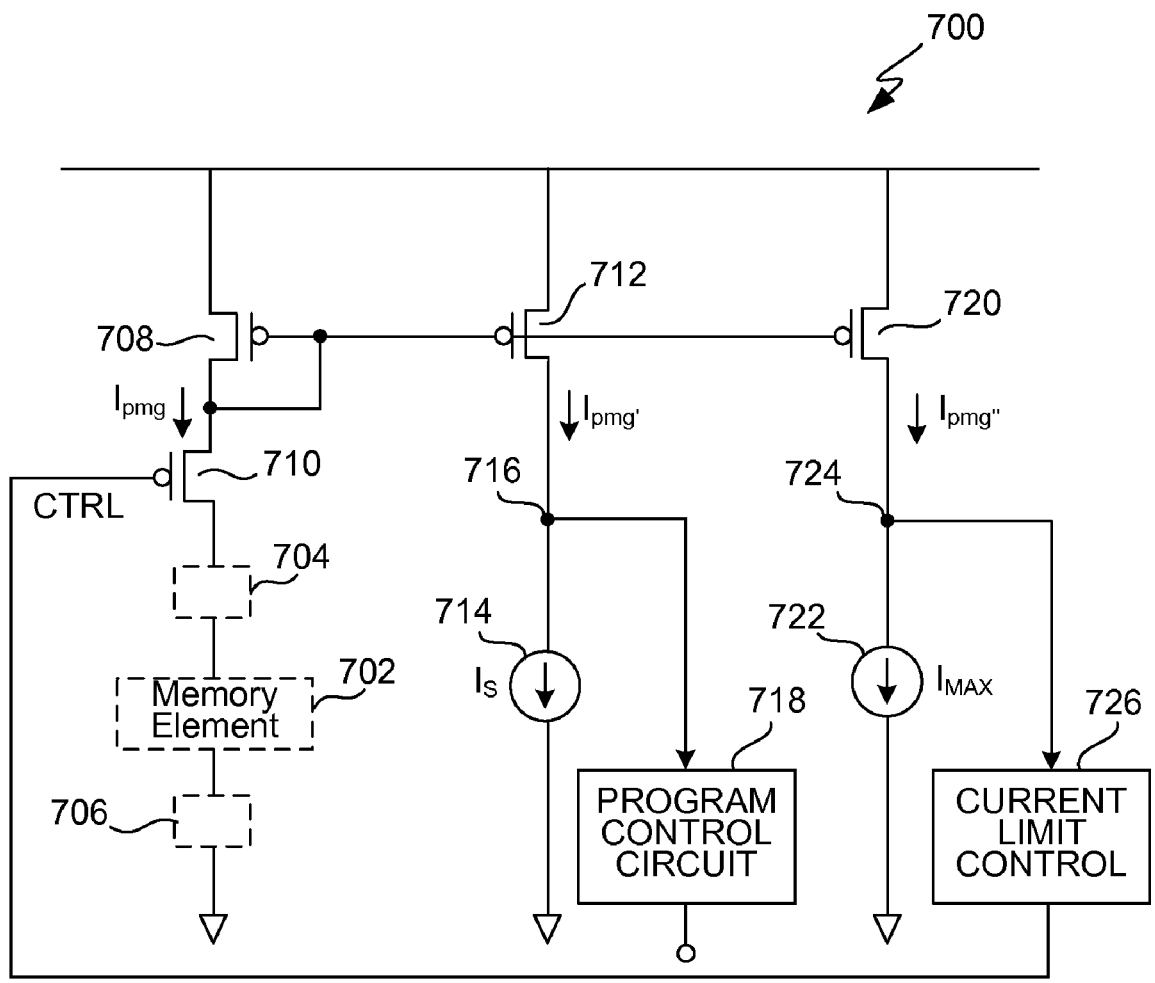
FIG. 7 is a schematic diagram of a memory device according to another embodiment of the invention.

FIG. 7 is a schematic diagram of a memory device 700 according to another embodiment of the invention. The memory device 700 illustrated in FIG. 7 provides monitoring for both programming current and excessive current.

The memory device 700 includes a memory element 702. The memory element 702 is coupled between a bitline 704 and a wordline 706. The memory device 700 operates, in one mode, to program the memory element 702 by applying a voltage across the memory element 702. The result of the voltage across the memory element 702 is to effectuate programming of the memory element 702. In one implementation, as the memory element 702 is being programmed, the program current (Ipmg) passing through the memory element 702 increases. At some point, the level of the program current (Ipmg) can signal that the memory element 702 has been adequately programmed.

The memory device 700 includes a first FET 708 that couples to a voltage potential (Vp) suitable for programming. The first FET 708 is utilized to provide the program current (Ipmg) that is used to program the memory element 702. A second FET 710 couples between the first FET 708 and the memory element 702. The second FET 510 can be utilized to limit the amount of current that can flow through to the memory element 702. For example, the FET 710 can be controlled to limit the program current (Ipmg) to a maximum level. A source terminal of the FET 708 is coupled to the voltage potential (Vp) and a drain terminal of the FET 708 is coupled to a drain terminal of the FET 710. A source terminal of the FET 710 is coupled to the memory element 702 by way of the bitline 704.

The memory device 700 also includes a FET 712 and a current source (Is) 714 and a node 716. The FET 712 has a source terminal connected to the voltage potential (Vp), a gate terminal connected to the gate terminal of the FET 708 and a drain terminal connected to the node 716. The FETs 708 and 712 provide a first current mirror used to compare a mirrored program current (Ipmg') with a sense reference current (Is). The program current (Ipmg) that passes from the source terminal to the drain terminal of the FET 708 is mirrored to the FET 712. Hence, the node 716 can determine whether the mirrored program current (Ipmg') exceeds the sense reference current (Is). When the mirrored program current (Ipmg') exceeds the sense reference current (Is), the node 716 is pulled high. When the node 716 is pulled high, a program control circuit 718 understands that the programming of the memory element 702 has been completed. At this point, either immediately or following a predetermined delay, the program control circuit 718 can disable further programming of the memory element 702 in any of a number of ways (including through use of the FET 710).

Still further, the memory device 700 also includes a FET 720 and a current source (Imax) 722 and a node 724. The FET 720 has a source terminal connected to the voltage potential (Vp), a gate terminal connected to the gate terminal of the FET 708 and a drain terminal connected to the node 724. The FETs 708 and 720 provide a second current mirror used to compare a mirrored program current (Ipmg") with a maximum current (Imax). The program current (Ipmg) that passes from the source terminal to the drain terminal of the FET 708 is mirrored to the FET 720. Hence, the node 724 can determine whether the mirrored program current (Ipmg") exceeds the maximum current (Imax). When the mirrored program current (Ipmg") exceeds the maximum current (Is), the node 724 is pulled high. When the node 724 is pulled high, a current limit control 726 understands that the program current is excessive and should be limited. At this point, the current limit control 726 can disable further programming of the memory element 702. For example, as shown in FIG. 7, the current limit control 726 can supply a control signal (CTRL) to the gate of the FET 710 so that the program current (Ipmg) does not exceed the maximum current (Imax). In this embodiment, the limiting of the program current (Ipmg) is not directly provided in an analog domain as one or more other embodiments, but is instead provided by feedback control (e.g., in a digital domain) which has some inherent delay.

The invention can be particularly useful for use with two-terminal memory cells. Two-terminal memory cells, for example, can be formed from polysilicon diodes, transition metal oxide (e.g., NiO) memory elements, and chalcogenide-based memory elements. Two-terminal memory arrays can be formed in a compact manner when arranged into cross-point memory arrays. Additional details on some two-terminal memory cells are provided in the following papers which are hereby incorporated herein by reference: (i) Pirovano et al., "Electronic Switching in Phase-Change Memories," IEEE Transactions on Electronic Devices, Vol. 51, No. 3, March 2003; (ii) Baek et al., "Multi-layer Cross-point Binary Oxide Resistive Memory (OXRRAM) for Post-NAND Storage Application," IEEE International Electron Devices Meeting, IEEE, 2005; (iii) Baek et al., "Highly Scalable Non-volatile Resistive Memory using Simple Binary Oxide Driven by Asymmetric Unipolar Voltage Pulses," IEEE International Electron Devices Meeting, IEEE 2004; and (iv) Hwang et al., "Writing Current Reduction for High-density Phase-change RAM," IEEE International Electron Devices Meeting, IEEE, 2003. Additional details are also provided in U.S. Pat. No. 6,891,748, which is hereby incorporated herein by reference.

Additional details on detecting whether a memory cell being programmed is in a programmed state are provided in U.S. Pat. No. 6,574,145, which is hereby incorporated herein by reference. For additional information on program current control when programming memory elements, see (i) U.S. patent application Ser. No. 11/552,462, filed Oct. 24, 2006, and entitled "METHOD FOR CONTROLLING CURRENT DURING PROGRAMMING OF MEMORY CELLS", which is hereby incorporated herein by reference; and (ii) U.S. patent application Ser. No. 11/552,472, filed Oct. 24, 2006, and entitled "MEMORY DEVICE FOR CONTROLLING CURRENT DURING PROGRAMMING OF MEMORY CELLS", which is hereby incorporated herein by reference.

The invention is suitable for use with both single-level (binary) memories and multi-level (multi-state) memories. In multi-level memories, each data storage element stores two or more bits of data.

As used herein "operatively connected" refers to direct or indirect electrical connection between electrical components.

The various features, aspects, embodiments or implementations can be used alone or in any combination.

The invention can further pertain to an electronic system that includes a memory system as discussed above. A memory system is a system that includes at least a memory device that provides data storage. Memory systems (i.e., memory cards) are commonly used to store digital data for use with various electronics products. The memory system is often removable from the electronic system so the stored digital data is portable. The memory systems according to the invention can have a relatively small form factor and be used to store digital data for electronics products (e.g., consumer electronic products) that acquire data, such as cameras, hand-held or notebook computers, network cards, network appliances, set-top boxes, hand-held or other small media (e.g., audio) players/recorders (e.g., MP3 devices), personal digital assistants, mobile telephones, and medical monitors.

The advantages of the invention are numerous. Different embodiments or implementations may yield one or more of the following advantages. One advantage of the invention is that a programming current used to program a memory element (i.e., memory cell) is limited so as not exceed a maximum current. This serves to protect the memory element from potentially damaging high current levels, such as while programming the memory element or at other times. Another advantage of the invention is that sensing current to monitor programming of a memory element can be provided separate from limiting programming current to a maximum current. Still another advantage of the invention is that a higher programming voltage can be used for faster programming since the program current is otherwise limited to the maximum current. Another advantage of the invention is that memory elements to be programmed can be pre-charged while protecting the memory elements from excessive currents. Yet another advantage of the invention is that programming time to program a memory element can be optimized.

The many features and advantages of the present invention are apparent from the written description. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A memory device, comprising:
   a non-volatile memory element; the words a programming switch for controlling supply of a program current to said non-volatile memory element when programming is performed;
   a current monitor operatively connected to said non-volatile memory element, said current monitor configured to monitor a program current flowing through said non-volatile memory element; and
   a current limiter operatively connected to said non-volatile memory element, said current limiter configured to restrict the current flowing through said non-volatile memory element,
   wherein the current limit level established by said current limiter is set higher than the intended program current.

2. A memory device as recited in claim 1,
   a program controller operatively connected to said current monitor and said programming switch, said program controller configured to control said programming switch to enable or disable programming of said non-volatile memory element based at least in part on the program current monitored by said current monitor.

3. A memory device as recited in claim 1, wherein said non-volatile memory element is a diode-based memory element.

4. A memory device as recited in claim 3, wherein said diode-based memory element is an antifuse device.

5. A memory device as recited in claim 1, wherein said non-volatile memory element is a two-terminal memory element.

6. A memory device as recited in claim 1, wherein said non-volatile memory element is a memory cell within a plurality of layers of memory cells stacked vertically above one another.

7. A memory device as recited in claim 1, wherein said programming switch includes at least a field-effect transistor.

8. A memory device as recited in claim 1, wherein said current monitor includes at least a first current mirror circuit having a first reference current.

9. A memory circuit as recited in claim 8, wherein said current limiter includes at least a second current mirror circuit having a second reference current, and a field-effect transistor (FET) operatively connected to the current mirror circuit.

10. A memory device comprising:
a memory array including a plurality of layers of memory cells stacked vertically above one another in a single chip;
a detection circuit operative to detect, while a memory cell of the memory array is being programmed, when the memory cell is in a programmed state; and
a memory cell protection circuit coupled to said detection circuit and the memory, said memory cell protection circuit being operative to protect the memory cell of the memory array against excessive electrical energy at least while the memory cell is being programmed.

11. A memory device as recited in claim 10, wherein said memory cell protection circuit limits current through the memory cell so as to not exceed a maximum current level.

12. A memory device as recited in claim 10, wherein said detection circuit detects that the memory cell is in the programmed state based on a current level through the memory cell during programming.

13. A memory device as recited in claim 12,
wherein said detection circuit includes at least a first current mirror circuit, and
wherein said memory cell protection circuit includes at least a second current mirror circuit.

14. A memory device as recited in claim 10, wherein the memory cells are non-volatile memory elements.

15. A memory device as recited in claim 10, wherein the memory cells are diode-based memory elements.

16. A memory device as recited in claim 15, wherein each of the diode-based memory elements is an antifuse device.

17. A memory device as recited in claim 10, wherein the memory cells are two-terminal memory elements.

18. A memory device as recited in claim 10, wherein the detection circuit is further operative to terminate the programming of the memory cell when the memory cell is detected to be in the programmed state.

19. A memory device as recited in claim 18, wherein the detection circuit terminates the programming of the memory cell by removing a programming voltage from a bitline or wordline coupled to the memory cell.

20. A memory device as recited in claim 10, wherein said memory device further comprises:
an additional memory cell and an additional detection circuit operative to detect, while the additional memory cell is being programmed, when the additional memory cell is in a programmed state.

21. A memory device as recited in claim 20, wherein said memory device further comprises:
an additional memory cell protection circuit operative to protect the additional memory of the memory array against excessive electrical energy at least while the additional memory cell is being programmed.

22. A memory device as recited in claim 10, wherein the memory cell comprises an antifuse.

23. A memory device as recited in claim 10, wherein the memory cell comprises a write-once memory cell.

24. A memory device as recited in claim 10, wherein the memory cell comprises a write-many memory cell.

25. A memory device as recited in claim 10, wherein the memory cell comprises a field-programmable memory cell.

26. An electronic system, comprising:
a data acquisition device; and
a data storage device removably coupled to said data acquisition device, said data storage device storing data acquired by said data acquisition device, and said data storage device including at least:
an array of data storage elements;
a detection circuit operative to detect, while a data storage element of said array is being programmed, when the data storage element is in a programmed state; and
a protection circuit coupled to said detection circuit and the data storage element, said protection circuit being operative to protect the data storage element of said array against excessive electrical energy at least while the data storage element is being programmed.

27. An electronic system as recited in claim 26, wherein said protection circuit limits current through the data storage element so as to not exceed a maximum current level.

28. An electronic system as recited in claim 27, wherein said protection circuit include a current mirror and a maximum current source that operate to limit the current through the data storage element so as to not exceed the maximum current level.

29. An electronic system as recited in claim 27,
wherein said protection circuit include a first current mirror and a maximum current source that operate to limit the current through the data storage element cell so as to not exceed the maximum current level, and
wherein said detection circuit includes a second current mirror and a sense current source that operate to sense data storage element is in a programmed state.

30. An electronic system as recited in claim 29, wherein said detection circuit further comprises a comparator that is used to produce a replicated current of the current through the data storage element.

31. An electronic system as recited in claim 30, wherein the replicated current is mirrored and then used to sense whether the data storage element is in the programmed state.

32. An electronic system as recited in claim 29, wherein, when the current through the memory cell exceeds the maximum current level, said protection circuit produces a digital signal that is used to reduce or stop the current through the data storage element.

33. An electronic system as recited in claim 30, wherein, by analog circuitry within said protection circuit, the current through the data storage element is prevented from exceeding the maximum current level.

34. An electronic system as received in claim 26, wherein said detection circuit detects that the data storage element is in the programmed state based on a current level through the data storage element during programming.

35. An electronic system as recited in claim 26,
wherein the data storage elements are non-volatile memory elements, and
wherein said array of data storage elements includes a plurality of layers of memory cells stacked vertically above one another in a single chip.

36. An electronic system as recited in claim 35, wherein the non-volatile memory elements are diode-based memory elements.

37. An electronic system as recited in claim 35, wherein the non-volatile memory elements are a two-terminal memory element.

38. An electronic system as recited in claim 26, wherein the detection circuit is further operative to terminate programming of the data storage element when the data storage element is detected to be in the programmed state.

39. An electronic system as recited in claim 38, wherein said data acquisition device is one of a camera, a network card or appliance, a hand-held or notebook computer, a set-top box, a hand-held or other small media player/recorder, personal digital assistant, mobile telephone, and a medical monitor.

* * * * *